United States Patent [19] [11] 4,395,512
Kubota et al. [45] Jul. 26, 1983

[54] POLYPHENYLENESULFIDE RESIN COMPOSITION

[75] Inventors: Yoshihiro Kubota, Takasaki; Osamu Kuriyama, Annaka, both of Japan

[73] Assignee: Shin-Etsu Chemical Co., Ltd., Tokyo, Japan

[21] Appl. No.: 381,563

[22] Filed: May 24, 1982

[30] Foreign Application Priority Data

Jun. 8, 1981 [JP] Japan .................................. 56-87945

[51] Int. Cl.$^3$ ............................................. C08K 3/10
[52] U.S. Cl. .................................. 524/413; 524/425; 524/426; 524/442; 524/424; 524/432; 524/433; 524/437; 524/445; 524/448; 524/502; 524/496; 524/521; 524/535; 524/545; 524/546; 525/189; 525/388; 525/104
[58] Field of Search ...................... 525/189, 388, 104; 524/413, 425, 426, 442, 424, 432, 433, 437, 445, 448, 502, 496, 521, 535, 545, 546

[56] References Cited

U.S. PATENT DOCUMENTS 3,963,605 6/1976 Seabourn ............................ 525/189
4,026,863 5/1977 Iseki et al. ........................... 525/189
4,212,923 7/1980 Brady ................................. 525/189

Primary Examiner—Melvyn I. Marquis
Attorney, Agent, or Firm—Toren, McGeady and Stanger

[57] ABSTRACT

The invention provides a novel resin composition based on a polyphenylenesulfide resin which can be molded into shaped articles imparted with remarkably improved impact strength, cracking resistance and heat shock resistance. The inventive resin composition comprises 100 parts by weight of a polyphenylenesulfide resin, from 10 to 300 parts by weight of an inorganic filler and from 1 to 100 parts by weight of a fluorine-containing rubber such as a copolymer of vinylidene fluoride and hexafluoropropylene having specified Mooney viscosity.

2 Claims, No Drawings

POLYPHENYLENESULFIDE RESIN COMPOSITION

BACKGROUND OF THE INVENTION

The present invention relates to a polyphenylenesulfide resin composition having improved mechanical properties or, more particularly, a polyphenylenesulfide resin composition imparted with excellent impact resistance, resistance against crack formation and heat-shock resistance.

Polyphenylenesulfide resins are known as belonging to a class of thermoplastic synthetic resins having excellent heat resistance and widely employed in various fields of applications. One of the disadvantages inherent to the resins of this type is the remarkable brittleness of the shaped articles of the resin so that it is usual that shaped articles of the resin are molded with a resin composition formulated with an inorganic fibrous material such as glass fibers or an inorganic filler such as finely divided silica, talc, clay and the like to be improved in respect of the brittleness.

Notwithstanding the means of reinforcement by use of glass fibers or inorganic fillers, however, the improvement in the impact resistance is particularly insufficient among the properties required for modern plastic resins such as impact resistance, cracking resistance, moldability and the like so that the application of polyphenylenesulfide resins is limited in certain fields.

Therefore, it has been a problem to be solved in the plastic processing technology to develop a polyphenylenesulfide resin composition imparted with impact resistance, cracking resistance and heat-shock resistance improved by far to have a performance suitable for the applications in various fields.

SUMMARY OF THE INVENTION

It is therefore an object of the present invention to provide a novel and improved resin composition based on a polyphenylenesulfide resin having very good moldability in the fabrication of a shaped article, which is imparted with greatly improved mechanical properties, in particular, in respect of the impact resistance, cracking resistance, heat-shock resistance and the like.

The polyphenylenesulfide resin composition of the present invention established as a result of the extensive investigations undertaken by the inventors comprises (a) 100 parts by weight of a polyphenylenesulfide resin, (b) from 10 to 300 parts by weight of an inorganic filler, and (c) from 1 to 100 parts by weight of a fluorine-containing rubber having a Mooney viscosity as specified in ASTM D 1646 in the range from $5-ML1+10$ (100° C.) to $300-ML1+10$ (121° C.).

DETAILED DESCRIPTION OF THE PREFERRED EMBODIMENTS

Different from the conventional polyphenylenesulfide resin compositions of which the shaped articles are susceptible to frequent crack formation either directly after molding or in a heat cycle test, i.e. repeated cycles of heating and cooling, the above described resin composition of the invention is unexpectedly free from the problem of the crack formation. This remarkable effect is presumably due, in addition to the absorption of the impact energy by the fluorine-containing rubber as the component (c), the rubber component is effective to absorb or compensate the stress formed in the shaped article directly after molding or in the repeated expansion and shrinkage in the heat cycle test.

Therefore, the inventive resin composition can be used very advantageously in various fields of applications, for which conventional polyphenylenesulfide resin compositions are quite unsuitable, such as the parts of automobiles to withstand frequent and heavy vibration or impact, printed circuit boards to be worked by drilling, punching, cutting or bending, encapsulation of electric and electronic devices, e.g. integrated circuits, transistors, diodes, capacitors, resistors and the like, and coating of the bottom surface of irons subjected to frequent repetition of heating and cooling.

The polyphenylenesulfide resin as the component (a) of the inventive resin composition is a well known thermoplastic synthetic resin described, for example, in U.S. Pat. No. 3,354,129. A typical method for the preparation of polyphenylenesulfide resins is the polycondensation reaction of 1,4-dichlorobenzene and sodium sulfide. Commercial products of the polyphenylenesulfide resins include both of the uncrosslinked type and crosslinked type. Various grades of the polyphenylene sulfide resins are manufactured and sold by, for example, Phillips Petroleum Co. with the tradenames of Ryton V-1 as an example of the former class and Ryton P-4, Ryton P-6 and Ryton R-6 as examples of the latter class. They are used either singly or as a combination of two kinds or more. Both types of the resins may be used as combined.

The inorganic filler as the component (b) includes various kinds of finely divided particulate and fibrous materials exemplified by siliceous fillers such as precipitated silica, fumed silica, powdered quartz and diatomaceous earth, metal oxides such as titanium dioxide, aluminum oxide and zinc oxide, metal carbonates such as calcium carbonate, magnesium carbonate and zinc carbonate, metal hydroxides such as aluminum hydroxide and magnesium hydroxide, inorganic fibers such as asbestos, glass fibers and carbon fibers, glass beads, glass microballoons, clay, powdered mica, talc and the like. It is sometimes advantageous that the surface of these inorganic fillers are treated in advance with a coupling agent such as certain kinds of organosilanes and organopolysiloxanes.

The fluorine-containing rubber as the component (c) is an essential component to be formulated together with the inorganic filler in order that the shaped articles of the inventive resin composition are imparted with markedly improved impact resistance, cracking resistance and heat-shock resistance. Several types of fluorine-containing rubbers are commercially manufactured and sold on the market. Exemplary of them are: copolymers of vinylidene fluoride and hexafluoropropylene sold with the tradenames of Viton A and Viton AHV by E. I. DuPont Co.; copolymers of vinylidene fluoride, hexafluoropropylene and tetrafluoroethylene sold with the tradenames of Viton B and Viton B-50 by E. I. DuPont de Nemours Co. and DAI-EL G-501 by Daikin Kogyo Co. In addition to the above named preferred ones, other types of fluorine-containing rubbers are also suitable including: copolymers of tetrafluoroethylene and propylene with the tradenames of Aflas 100 and Aflas 150 by Asahi Glass Co.; copolymers of vinylidene fluoride and trifluorochloroethylene sold with the tradename of Kel-F Elastomer by Minesota Mining & Manufacturing Co.; 1,1-dihydrofluorobutyl acrylate rubbers sold with the tradenames of fluororubbers 1F4 and 2F4 by the same company; fluoroalkyl organopolysiloxane rubbers sold with the tradenames of Silastic LS-53 by Dow Corning Corp. and FE-251 by Shin-Etsu Chemical Co.; and polymers of hexafluoropentamethylene adipate sold with the tradename of Fluoropolyester by Fooker Chemical Co. These fluorine-containing rubbers may be used either singly or as a combination of two kinds or more according to need.

Among the above named fluorine-containing rubbers, preferred ones should be less susceptible to thermal decomposition at the temperature of molding as measured by the weight decrease by heating in view of the extremely high molding temperature of the polyphenylenesulfide resins ranging between 290° C. and 360° C. as the temperature of the cylinder of the molding machines. In this connection, as is mentioned above, the copolymers of vinylidene fluoride and hexafluoropropylene and the copolymers of vinylidene fluoride, hexafluoropropylene and tetrafluoroethylene are recommended although these copolymers may contain small amounts of other unsaturated compounds as the monomeric constituents copolymerized therewith.

It should be noted that the component (c) in the inventive resin composition is a rubber-like elastomeric polymer and the resinous polymers such as the polymers of tetrafluoroethylene and copolymers of tetrafluoroethylene and ethylene are not suitable in respect of obtaining improved impact resistance as the primary object of the present invention.

The fluorine-containing rubber products as named above to be formulated in the inventive resin composition should also satisfy a requirement in the Mooney viscosity since otherwise the performance of the resin composition cannot be improved as desired in respect of the moldability of the resin composition and the properties of the shaped articles such as impact resistance, cracking resistance and heat-shock resistance. Preferable range of the Mooney viscosity is from $5-ML1+10$ (100° C.) to $300-ML1+10$ (121° C.) as determined by the procedure specified in ASTM D 1646. This limitation is given because a fluorine-containing rubber having a Mooney viscosity smaller than $5-ML1+10$ (100° C.) has no sufficient effect of improving the impact resistance while a fluorine-containing rubber having a Mooney viscosity larger than $300-ML1+10$ (121° C.) gives rise to an excessive increase in the viscosity of the resin composition formulated therewith so that difficulties are encountered in molding the resin composition into shaped articles due to the poor flowability of the resin composition at an elevated temperature. This component (c) may be a blend of two or more kinds of the fluorine-containing rubbers. A rubber blend is suitable of which at least one of the component rubbers has a Mooney viscosity specified above and the other has a Mooney viscosity lower than the above specified range provided that the Mooney viscosity of the blend as a whole is in the above specified range.

The inventive polyphenylenesulfide resin composition can be prepared by uniformly blending the above described components (a), (b) and (c) and the preferable ranges of the amounts of the components (b) and (c) are, per 100 parts by weight of the component (a), from 10 to 300 parts by weight and from 1 to 100 parts by weight, respectively. When the amounts of the components (b) and (c) are smaller than the above given lower limits, the shaped articles molded of such a resin composition are remarkably inferior in the mechanical strengths and impact resistance while excessive amounts of these components over the above given upper limits result in an increased viscosity and poor flowability of the resin composition so that the shaped article of the resin composition cannot have a beautiful and pleasant appearance. It is optional that a part of the fluorine-containing rubber may be replaced with a fluorine-containing rubber having a relatively low viscosity in order to control the viscosity and flowability of the resin composition.

The inventive resin composition, which essentially comprises the components (a), (b) and (c), may also contain several additives including pigments such as carbon black, chromium oxide, iron oxide and the like, lubricants such as stearic acid and metal salts thereof, silane coupling agents such as N-(2-aminoethyl)-3-aminopropyl methyl dimethoxysilane and the like, silicone fluids, waxes and others in such amounts that the advantages of the present invention are not unduly decreased.

The resin composition of the present invention may be prepared by uniformly blending the components (a), (b) and (c) as such together with the optional additives followed by pelletizing by use of an extruder or the like machine but, when a higher degree of the uniformity of the dispersion of the fluorine-containing rubber as the component (c) is desired, the fluorine-containing rubber is first dissolved in a suitable solvent to give a solution which is then admixed with the components (a) and/or (b) followed by the removal of the solvent by evaporation, blending with the other component and optional additives and compounding by use of an extruder or the like machine.

The polyphenylenesulfide resin composition of the invention prepared in the above described manner can be fabricated into shaped articles by a conventional molding method such as injection molding, compression molding and the like without particular limitations in the method of molding.

Following are the examples to illustrate the preparation and advantages of the inventive resin compositions in further detail but not to limit the scope of the invention.

EXAMPLE 1

Polyphenylene sulfide resin compositions No. 1 to No. 10 were prepared each by compounding the components with the formulation indicated in Table 1 below in parts by weight by use of an extruder. Each of the compositions were fabricated into 100 pieces of 14-lead IC frames with an injection machine under the conditions of the temperature of the cylinder at 320° C., temperature of the mold at 150° C. and the pressure for injection of 100 kg/cm$^2$.

The leads of each of the shaped articles were trimmed by cutting with a lead cutter and the molded ICs were examined microscopically for the crack formation due to the impact in cutting. The percentages of the numbers of the cracked ICs are shown in the table as a measure of the improvement in the impact resistance.

Further, the molded ICs were subjected to a heat cycle test of 100 times of the repeated cycles each composed of cooling at $-50°$ C. for 30 minutes immediately followed by heating at 200° C. for 30 minutes. The percentages of the numbers of the cracked test pieces are shown in the table as a measure of the heat-shock resistance.

As is clear from the results shown in Table 2, the formulation with the fluorine-containing rubbers is very effective in improving the cracking resistance and the heat-shock resistance of the articles shaped of the polyphenylenesulfide resin compositions.

Following are the characterizations of the components used in the formulations shown in Table 1.

Polyphenylenesulfide resin A: Ryton P-4, a product by Phillips Petroleum Co., crosslinked type Polyphenylenesulfide resin B: Ryton V-1, a product by Phillips Petroleum Co., uncrosslinked type Filler A: glass fibers having an average fiber length of about 20 μm Filler B: powdered quartz having an average particle diameter of about 5 μm Filler C: talc having an average particle diameter of about 2 μm Fluorine-containing rubber A: Viton C-10, a product by E. I. DuPont de Nemours Co. having a Mooney viscosity of $7-ML1+10$ (100° C.)

Fluorine-containing rubber B: Viton A, a product by E. I. DuPont de Nemours Co. having a Mooney viscosity of $67-ML1+10$ (100° C.)

Fluorine-containing rubber C: Viton B, a product by E. I. DuPont de Nemours Co. having a Mooney viscosity of $73-ML1+10$ (121° C.)

Fluorine-containing rubber D: Viton AHV, a product by E. I. DuPont de Nemous Co. having a Mooney viscosity of $173-ML1+10$ (121° C.)

Fluorine-containing rubber E: Aflas 100, a product by Ashai Glass Co. having a Mooney viscosity of $85-ML1+10$ (100° C.)

Fluorine-containing rubber F: DAI-EL G-501, a product by Daikin Kogyo Co. having a Mooney viscosity of $100-ML1+10$ (100° C.)

Fluorine-containing rubber G: the rubber was prepared by the emulsion polymerization of a monomer mixture composed of 80% by weight of vinylidene fluoride and 20% by weight of hexafluoropropylene followed by salting-out by the addition of sodium sulfate. This rubber had a Mooney viscosity of $3-ML1+10$ (121° C.).

Fluorine-containing rubber H: the rubber was prepared by the emulsion polymerization in the same manner as in the preparation of the rubber G above except that the monomer mixture was composed of 30% by weight of vinylidene fluoride and 70% by weight of hexafluoropropylene. This rubber had a Mooney viscosity of $320-ML1+10$ (121° C.).

Additive A: carbon black sold with a tradename of RAVEN 1170 by Columbia Carbon Co.

Additive B: 3-glycidoxypropyl trimethoxysilane sold with a tradename of KBM 403 by Shin-Etsu Chemical Co.

TABLE 1

| Experiment No. | Polyphenylenesulfide resin (parts) | Filler (parts) | Fluorine-containing rubber (parts) | Additive (parts) |
|---|---|---|---|---|
| 1 | A (50) + B (50) | A (150) + B (100) | A (95) | A (2) + B (1) |
| 2 | B (100) | A (60) + B (40) | B (20) | B (1) |
| 3 | B (100) | A (80) + B (70) | A (5) + C (35) | A (2) |
| 4 | B (100) | A (80) + B (70) | D (40) | A (2) + B (1) |
| 5 | B (100) | A (80) + B (70) | E (40) | A (2) + B (1) |

TABLE 1-continued

| Experiment No. | Polyphenylenesulfide resin (parts) | Filler (parts) | Fluorine-containing rubber (parts) | Additive (parts) |
|---|---|---|---|---|
| 6 | B (100) | A (80) + B (70) | F (40) | A (2) + B (1) |
| 7 | B (100) | A (10) + C (2) | D (2) | A (2) + B (1) |
| 8 | B (100) | A (200) + B (50) | D (100) | A (2) + B (1) |
| 9 | A (100) | A (40) + B (80) | B (10) + C (95) | A (2) + B (1) |
| 10 | B (100) | A (40) + B (80) | None | A (2) + B (1) |
| 11 | B (100) | A (80) + B (80) | G (40) | A (2) + B (1) |
| 12 | B (100) | A (80) + B (70) | H (40) | A (2) + B (1) |

TABLE 2

| Experiment No. | Cracking by lead cutting, % | Cracking by heat cycle test, % | Flexural strength, kg/mm² | Appearance of shaped article |
|---|---|---|---|---|
| 1 | 5 | 7 | 7.0 | Excellent |
| 2 | 1 | 5 | 8.0 | Excellent |
| 3 | 0 | 0 | 6.5 | Excellent |
| 4 | 0 | 0 | 9.5 | Good |
| 5 | 10 | 13 | 6.0 | Some voids |
| 6 | 0 | 0 | 7.6 | Excellent |
| 7 | 12 | 16 | 4.0 | Excellent |
| 8 | 0 | 0 | 8.9 | Insufficient filling of mold |
| 9 | 0 | 0 | 6.8 | Excellent |
| 10 | 83 | 95 | 6.5 | Excellent |
| 11 | 65 | 80 | 6.0 | Good |
| 12 | Molded article not obtained (no filling of mold) | | | |

EXAMPLE 2

A fluorine-containing rubber was prepared by the emulsion polymerization in the same manner as in the preparation of the rubber G used in Example 1 except that the monomer mixture was composed of 40% by weight of vinylidene fluoride and 60% by weight of hexafluoropropylene. This rubber had a Mooney viscosity of $285-ML1+10$ (121° C.).

Five parts by weight of the above prepared fluorine-containing rubber were dissolved in 150 parts by weight of acetone and 100 parts by weight of a crosslinked polyphenylenesulfide resin (Ryton P-6, a product by Phillips Petroleum Co.) in a powdery form were dispersed in this solution of the rubber followed by stripping of the solvent to dryness. Into this blend of the resin and the rubber were admixed 80 parts by weight of glass fibers having an average fiber length of about 3 mm and 100 parts by weight of powdered quartz having an average particle diameter of about 10 μm to give a uniform compound which was extruded by use of an extruder.

The thus prepared resin composition was shaped into a plate for printed circuit board having a thickness of 1.5 mm by molding under a pressure of 120 kg/cm² at the temperature of the mold of 170° C. and the melt temperature of 340° C. The plate was examined for the workability in punching and for the impact strength with the DuPont impact tester to give the results shown in Table 3 below. For comparison, the same polyphenylenesulfide resin and the same glass fibers as used above were directly blended also in the same weight proportion without the treatment of the resin with the rubber solution. The results obtained with this comparative resin composition are shown in Table 3.

As is clear from these results, the punching test could be performed only with the resin plate prepared in accordance with the present invention by virtue of the remarkable improvement in the impact strength of the shaped articles of the resin composition.

TABLE 3

| Resin composition | Punching workability | DuPont impact strength, cm | Appearance |
|---|---|---|---|
| Inventive | Good | 20 | Somewhat poor in surface smoothness |
| Comparative | Cracks formed around punched holes | 7 | Good |

What is claimed is:
1. A polyphenylenesulfide resin composition which comprises
   (a) 100 parts by weight of a polyphenylenesulfide resin,
   (b) from 10 to 300 parts by weight of an inorganic filler, and
   (c) from 1 to 100 parts by weight of a fluorine-containing rubber having a Mooney viscosity as specified by ASTM D 1646 in the range from $5-ML1+10$ (100° C.) to $300-ML1+10$ (121° C.)
2. The polyphenylenesulfide resin composition as claimed in claim 1 wherein the fluorine-containing rubber is a copolymer of vinylidene fluoride and hexafluoropropylene or a copolymer of vinylidene fluoride, hexafluoropropylene and tetrafluoroethylene.

* * * * *